(12) United States Patent
Jung et al.

(10) Patent No.: US 9,530,742 B1
(45) Date of Patent: Dec. 27, 2016

(54) SEMICONDUCTOR DEVICE WITH STRUCTURAL STABILITY

(71) Applicant: SK hynix Inc., Gyeonggi-do (KR)

(72) Inventors: Sung Wook Jung, Gyeonggi-do (KR); Kyung Bo Kim, Gyeonggi-do (KR); Ji Hui Baek, Gyeonggi-do (KR); Jang Hee Jung, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/050,984

(22) Filed: Feb. 23, 2016

(30) Foreign Application Priority Data

Oct. 1, 2015 (KR) .................. 10-2015-0138694

(51) Int. Cl.
| | |
|---|---|
| H01L 23/48 | (2006.01) |
| H01L 23/52 | (2006.01) |
| H01L 29/40 | (2006.01) |
| H01L 23/00 | (2006.01) |
| H01L 23/528 | (2006.01) |
| H01L 23/522 | (2006.01) |
| H01L 27/115 | (2006.01) |
| H01L 27/06 | (2006.01) |

(52) U.S. Cl.
CPC .......... *H01L 23/562* (2013.01); *H01L 23/528* (2013.01); *H01L 23/5226* (2013.01); *H01L 27/0688* (2013.01); *H01L 27/11556* (2013.01); *H01L 27/11582* (2013.01)

(58) Field of Classification Search
CPC .............. H01L 23/528; H01L 27/0207; H01L 27/11529; H01L 27/11524; H01L 27/11573

USPC .................. 257/758, 786, 773, 774
See application file for complete search history.

(56) References Cited

U.S. PATENT DOCUMENTS

| | | | | |
|---|---|---|---|---|
| 6,897,552 | B2 * | 5/2005 | Nakao ................... | H01L 21/563 257/528 |
| 7,847,413 | B2 * | 12/2010 | Akiba ...................... | G11C 5/02 257/686 |
| 2012/0043673 | A1 * | 2/2012 | Chang ............... | H01L 27/11551 257/786 |
| 2014/0239248 | A1 * | 8/2014 | Johnson .............. | G11C 11/5692 257/5 |
| 2016/0020169 | A1 * | 1/2016 | Matsuda ............... | H01L 23/528 257/758 |

FOREIGN PATENT DOCUMENTS

| | | |
|---|---|---|
| KR | 1020110015337 | 2/2011 |
| KR | 1020120026435 | 3/2012 |

* cited by examiner

*Primary Examiner* — S. V. Clark
(74) *Attorney, Agent, or Firm* — IP & T Group LLP

(57) ABSTRACT

The present disclosure provides a semiconductor device with a structural stability. The semiconductor device includes a stack of vertical alterations of conductive layers and insulating layers; supports passing through the stack, each of the supports having a cross-section of an equilateral polygon, the supports being equidistantly arranged in a first direction and a second direction, the first and second directions crossing each other; and contact plugs electrically coupled respectively to the conductive layers, each of the contact plugs being disposed between at least two adjacent supports of the supports.

20 Claims, 16 Drawing Sheets

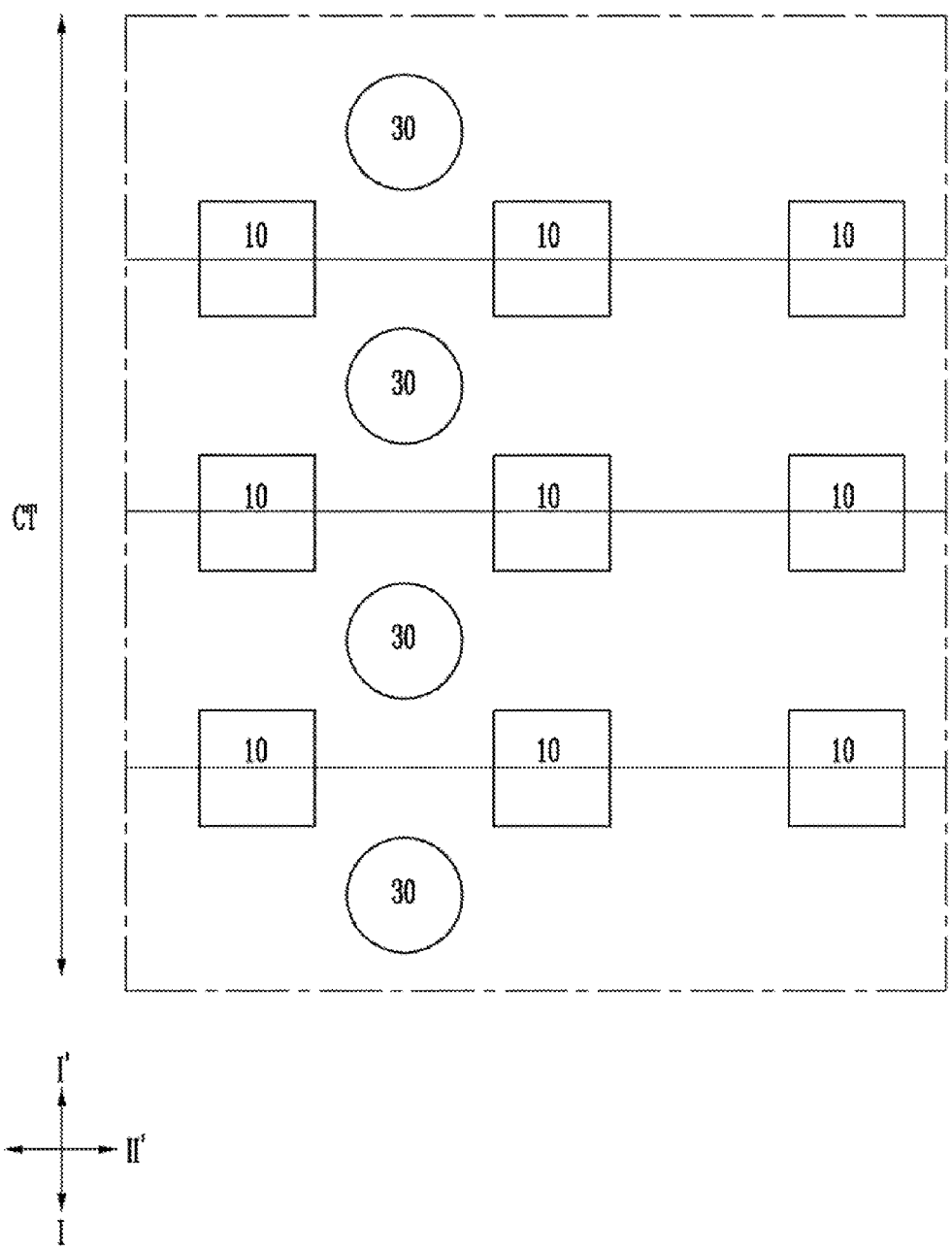

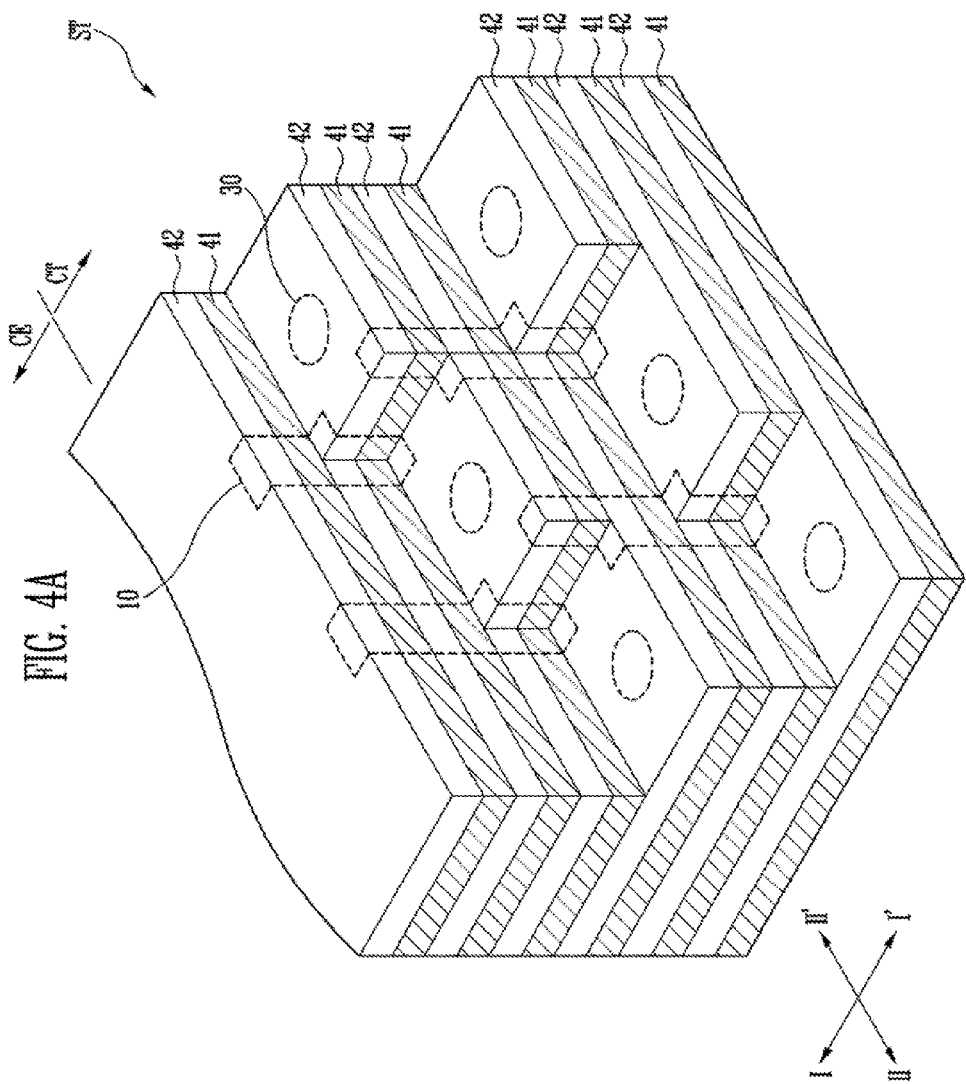

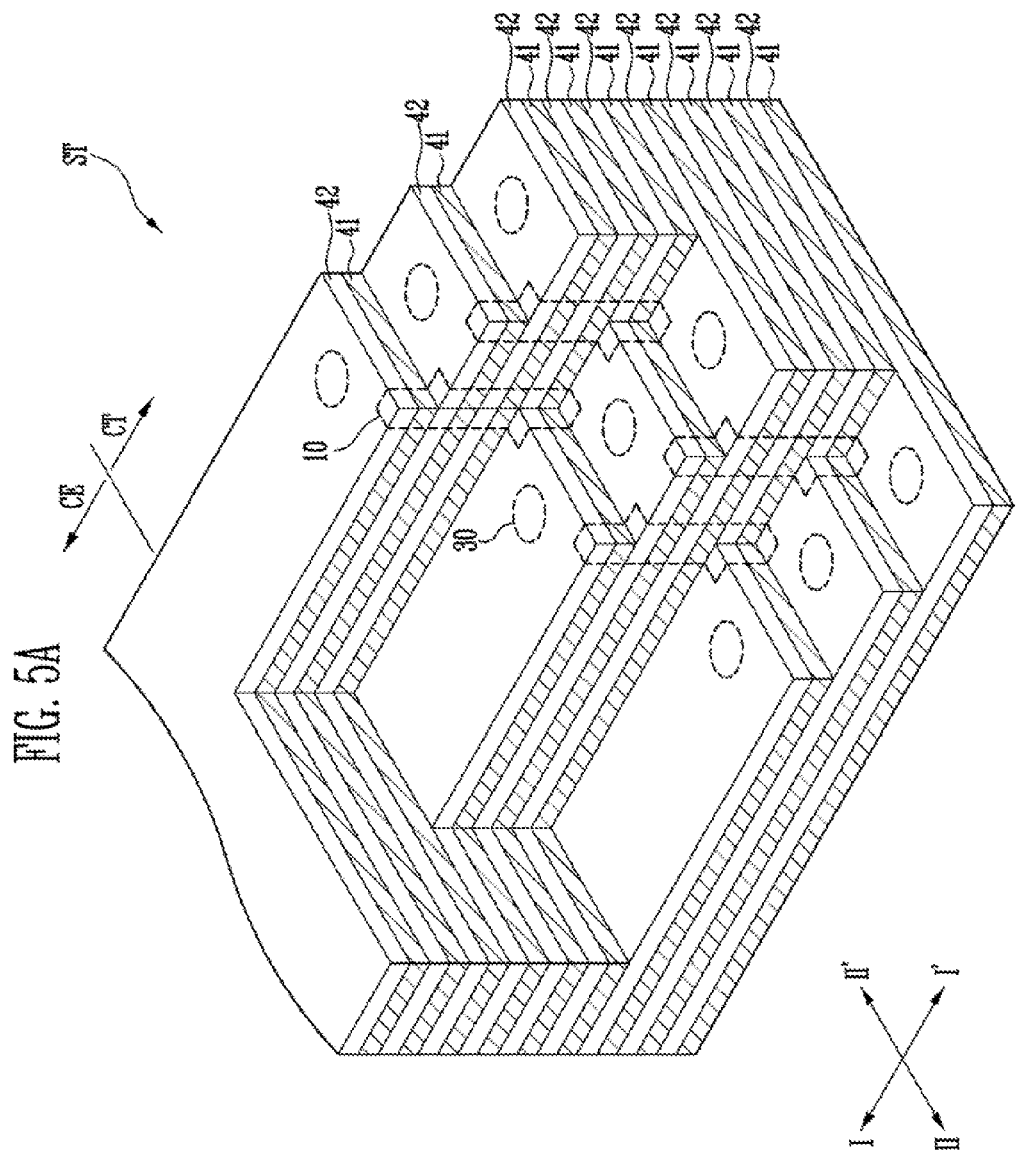

SEMICONDUCTOR DEVICE WITH STRUCTURAL STABILITY

CROSS-REFERENCE TO RELATED APPLICATION

The present application claims a priority to a Korean patent application number 10-2015-0138694 filed on Oct. 1, 2015, the entire disclosure of which is incorporated herein in its entirety by reference.

BACKGROUND

Technical Field

Embodiments of the present disclosure generally relate to a three-dimensional semiconductor device and more particularly to a three dimensional semiconductor device having improved structural stability.

Discussion of Related Arts

A nonvolatile memory device may keep stored-data even at a power-off state. As a two-dimensional memory device including a single array of memory cells on a silicon substrate reaches its integration limit, a three-dimensional (3D) non-volatile memory device including a stack of memory cells on a silicon substrate has been suggested.

For stacking the memory cells, the 3D non-volatile memory device may have vertical alternating layers of conductive and insulating materials. Further, for process efficiency, during various phases of the fabrication process, sacrificial insulating layers may also be vertically arranged temporarily as may be needed only to be replaced later with conductive layers. Replacement of the sacrificial layers with conductive layers is generally a challenging process and may inadvertently lead to a partial warp of collapse of the stack. As a result, a bridge may occur between one or more conductive layers, and thus the yield of the semiconductor device may be reduced.

SUMMARY

Embodiments of the present disclosure provide a semiconductor device with a structural stability, and an enhanced yield, and provide a method for manufacturing the semiconductor device.

In one aspect of the present disclosure, there is provided a semiconductor device comprising: a stack including alternately stacked conductive layers and insulating layers; supports passing through the stack, each of the supports having a cross-section of an equilateral polygon, the supports being equidistantly arranged in a first direction and a second direction, the first and second directions crossing each other; and contact plugs electrically coupled respectively to the conductive layers, each of the contact plugs being disposed between at least two adjacent supports of the supports.

In the present disclosure, the semiconductor device may include the supports extending through the stack, and each support may have a cross-section of an equilateral polygon, the supports being equidistantly arranged in a first direction and a second direction, the first and second direction crossing each other. In this way, the supports with a symmetrical form may be arranged in regular patterns. This may lead to a suppression of the warp or collapse of the stack.

BRIEF DESCRIPTION OF THE DRAWINGS

FIG. 3B to FIG. 3C illustrate layouts for a contact region in a stack structure of a semiconductor device, according to an embodiment of the present disclosure.

FIG. 4A illustrates a structure for a stack of a semiconductor device according to another embodiment of the present disclosure.

FIG. 5A illustrates a stack structure of a semiconductor device, according to yet another embodiment of the present disclosure.

DETAILED DESCRIPTIONS

Figure 1A:
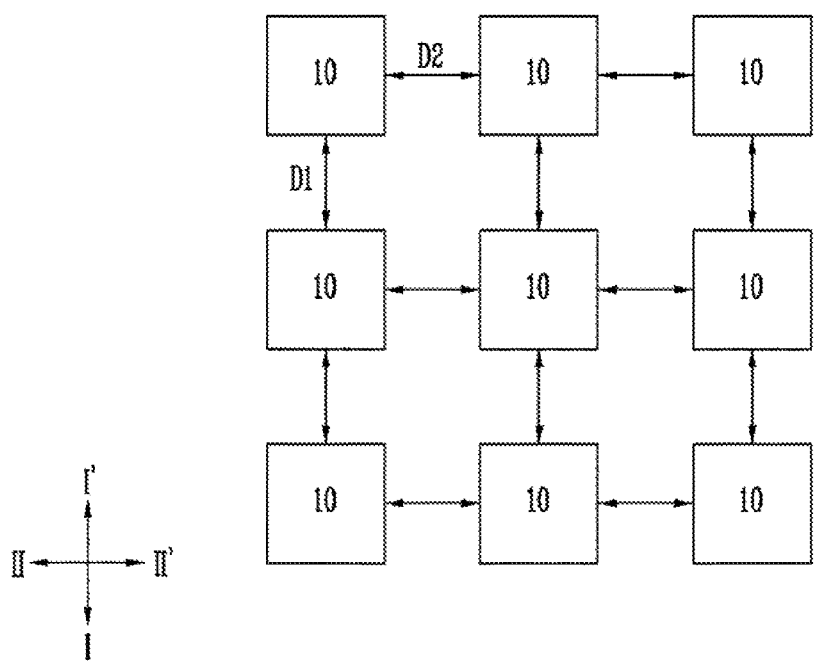
FIG. 1A to FIG. 1D illustrate layouts for a stack of a semiconductor device, according to embodiments of the present disclosure.

Various embodiments are described below in reference to the accompanying drawings. It will be understood that the description herein is not intended to limit the invention to the specific embodiments described. Hence, the present invention may be embodied in various different forms, and should not be construed as being limited to only the illustrated embodiments herein. Rather, the described embodiments are provided as examples so that this disclosure will be thorough and complete, and will fully convey the various aspects and features of the present invention to those skilled in the art.

It is also noted that those skilled in the art to which this invention pertains after having read the present disclosure may envisage numerous alternatives, modifications, and equivalents of the described embodiments without departing from the spirit and scope of the present invention as defined by the appended claims.

Further, it will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Also, it will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Moreover, the terminology used herein is for the purpose of describing particular embodiments only and is not intended to be limiting of the present disclosure. Also, as used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, and do not preclude the presence or addition of one or more other features, integers, operations, elements, components, and/or portions thereof. As used herein, the term "and/or" includes any and all combinations of one or more of the associated listed items.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in more detail with reference to the drawings.

Referring to FIG. 1A to FIG. 1D various examples of layouts for a stack of a semiconductor device are provided.

Figure 1B:
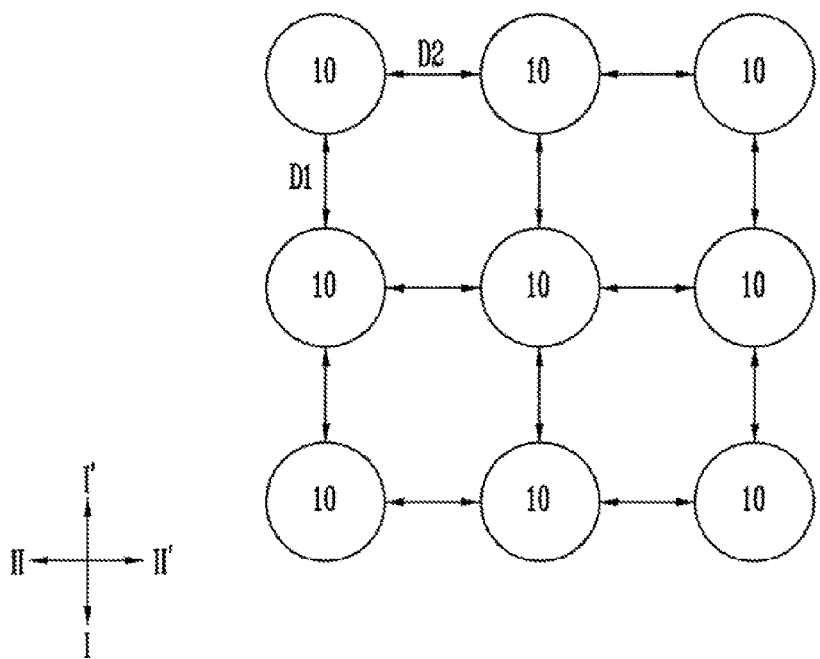
Figure 1C:
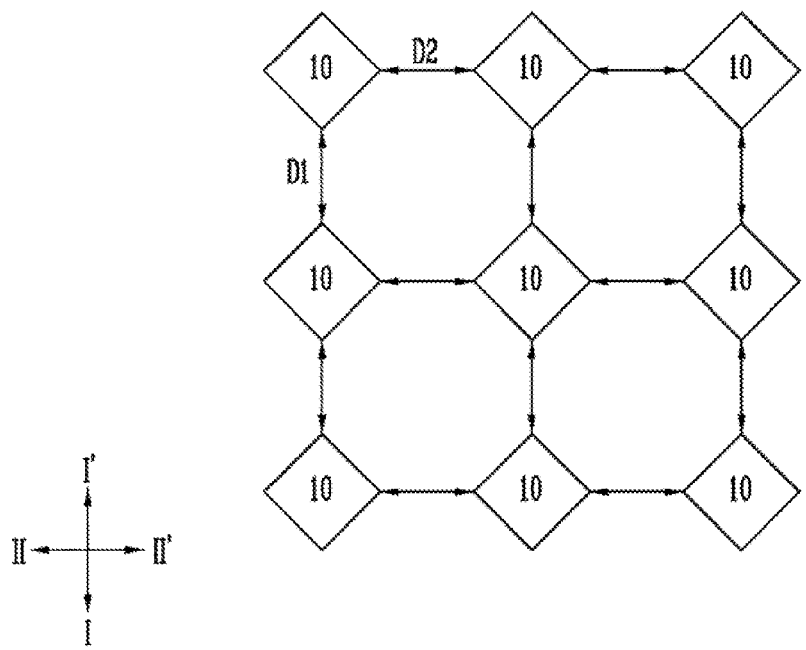
Figure 3A:
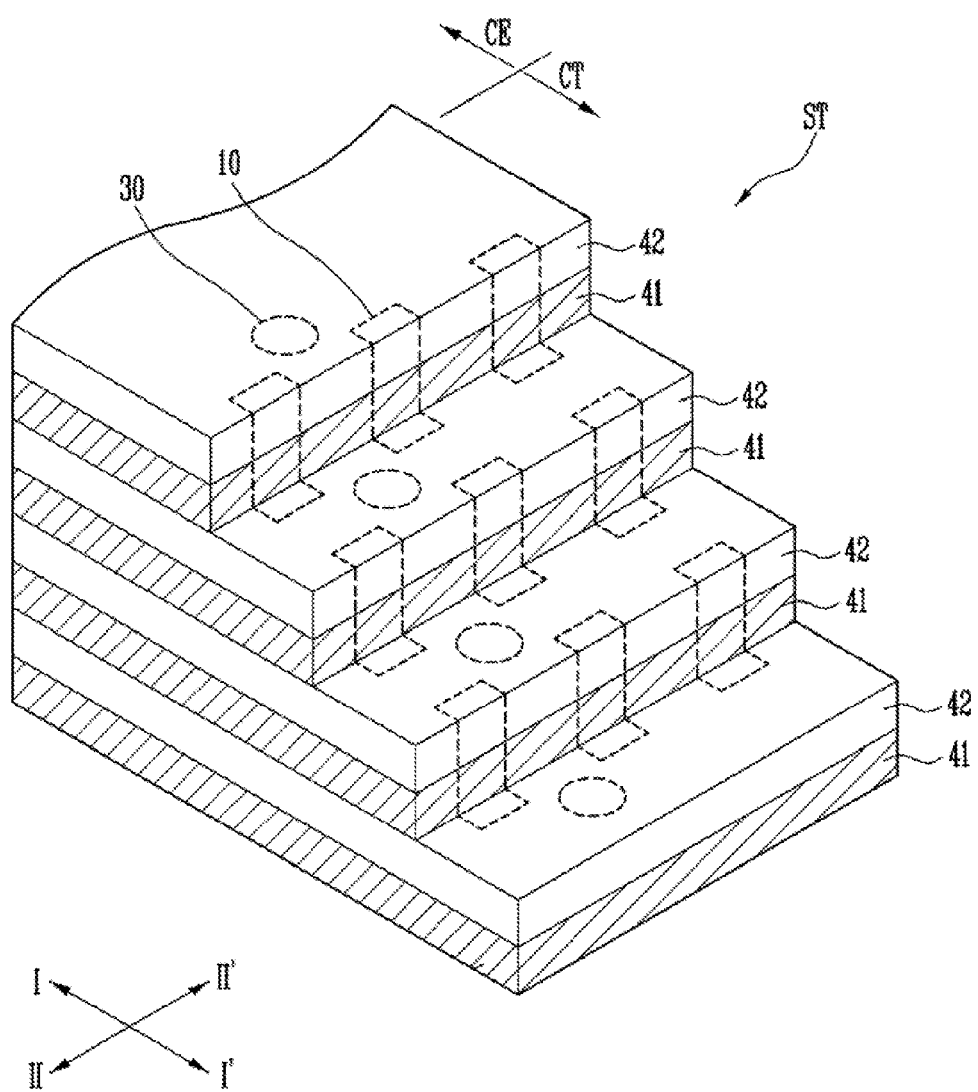
FIG. 3A illustrates a stack structure of a semiconductor device, according to an embodiment of the present disclosure.

Accordingly, referring to FIG. 1A to FIG. 1C, the semiconductor device may include a plurality of supports 10. Each of the supports 10 may pass through a stack of the semiconductor device. The stack may include alternately stacked insulating layers and conductive layers. The structures for the stack will be described later with reference to FIGS. 3A, 4 and 5A. In some embodiments, each of the supports 10 may pass through the stack in a contact region of the semiconductor device. The supports 10 may be spaced apart at regular intervals in a first direction I-I' and in a second direction II-II' crossing the first direction I-I'. The first direction I-I' may be perpendicular to the second direction II-II'.

Each of the supports 10 may have a cross-section of an equilateral polygon. Each of the supports 10 may have a circular cross-section. In some embodiments, the equilateral polygon may be a quadrilateral such as a square, or a rhombus. The equilateral polygon may include a polygon having a large number of equilateral sides resembling a circle. In an embodiment, FIG. 1A shows a square cross-section of each of the supports 10. In another embodiment, FIG. 1B shows a circular cross-section of each of the supports 10. In still another embodiment, FIG. 1C shows a rhombus cross-section of each of the supports 10.

The plurality of supports 10 may be arranged equidistantly. For example, adjacent supports 10 in the first direction I-I' may be spaced apart from each other at a first distance or interval D1. Adjacent supports 10 in the second direction II-II' may be spaced apart from each other at a second distance or interval D2. In the first direction I-I', the supports 10 may be spaced apart at regular intervals which are equal to first distance or interval D1. Further, in the second direction II-II', the supports 10 may be spaced apart at regular intervals which are equal to the second distance or interval D2. In some embodiments, the first distance D1 and the second distance D2 may be the same. In some embodiments, the first distance D1 and the second distance D2 may be different.

Figure 1D:
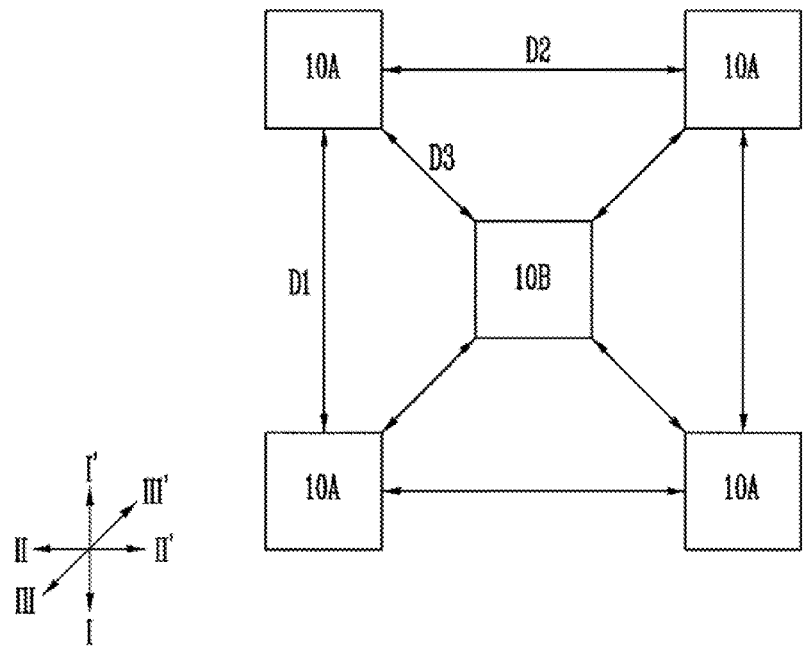

Referring to FIG. 1D, a plurality of first supports 10A may be equidistantly arranged in the first direction I-I' and second direction II-II' as shown in FIGS. 1A to 1C. However, in the embodiment of FIG. 1D, a second support 10B may be disposed between adjacent first supports 10A in a third direction III-III' crossing non-perpendicularly with the first and second directions I-I', and II-II'. For example, assuming that the first direction I-I' corresponds to a X axis, and the second direction II-II' corresponds to a Y axis, the second support 10B may be disposed between the adjacent first supports 10A in a diagonal direction relative to the X axis and Y axis.

The second support 10B may be disposed at a center within a square having four corners respectively corresponding to adjacent four first supports 10A in the first and second directions I-I', and II-II'. Thus, adjacent second support 10B and first supports 10A in the third direction III-III' may be spaced from each other by a third distance D3. In other words, the first supports 10A and the second support 10B may be alternately and equidistantly arranged in the third direction III-III'. The layout shown in FIG. 1D may be repeated, for example, to obtain a layout having three first supports 10A spaced apart at a regular interval D1 in the I-I' direction, three first supports 10A spaced apart at a regular interval D2 in the II-II' direction and four second supports 10B one at the center of each square having four corners respectively corresponding to adjacent four first supports 10A in the first and second directions I-I', and II-II'.

According to the above embodiments, the plurality of supports 10, 10A, and 10B may be patterned in regular patterns, and thus may lead to a uniform density distribution of the pattern of the supports. Accordingly, it is possible to provide a uniform control in terms of an etching depth, width, etc. in an etching process of the semiconductor device.

FIG. 2A to FIG. 2H illustrate further examples of layouts according to different embodiments of the present disclosure. In an embodiment, the semiconductor device may include a plurality of supports and each of the support may have, but not limited to, an equilateral polygon cross-section such as a square cross-section or a rhombus cross-section. In another embodiment, each of the supports may have a circular cross-section, or of an equilateral polygon having a large number of sides that may resemble a circular cross-section. In yet another embodiment, the semiconductor device may include a plurality of first supports having an equilateral polygon cross-section such as a square cross-section or a rhombus and a plurality of second supports having a circular cross-section, or of an equilateral polygon having a large number of sides that may resemble a circular cross-section.

Referring to FIGS. 2A to 2D, the semiconductor device may include a plurality of supports 10 and a plurality of contact plugs 30. The contact plugs 30 may be positioned in a contact region of a stack of the semiconductor device. In some embodiments, as shown in FIGS. 3A, 4A and 5A, the stack may include alternately stacked insulating layers and conductive layers. The plurality of contact plugs 30 may be electrically coupled respectively to the plurality of conductive layers in the stack. Further, the supports 10 may be arranged equidistantly in the first and second directions, I-I', II-II', wherein the second direction may be crossing the first direction. In the embodiments shown in FIGS. 2A to 2H the first and second directions are perpendicular to each other. However, the invention may not be limited in this regard. Each of the contact plugs 30 may be disposed between adjacent supports 10. For example, each of the contact plugs may be disposed between adjacent supports in the first direction I-I', or in the second direction II-II', or in both the first and second directions I-I', II-II', or at a center of a square having four corners corresponding respectively to adjacent four supports in the first and second directions I-I', and II-II', and/or any combinations thereof.

Figure 2A:
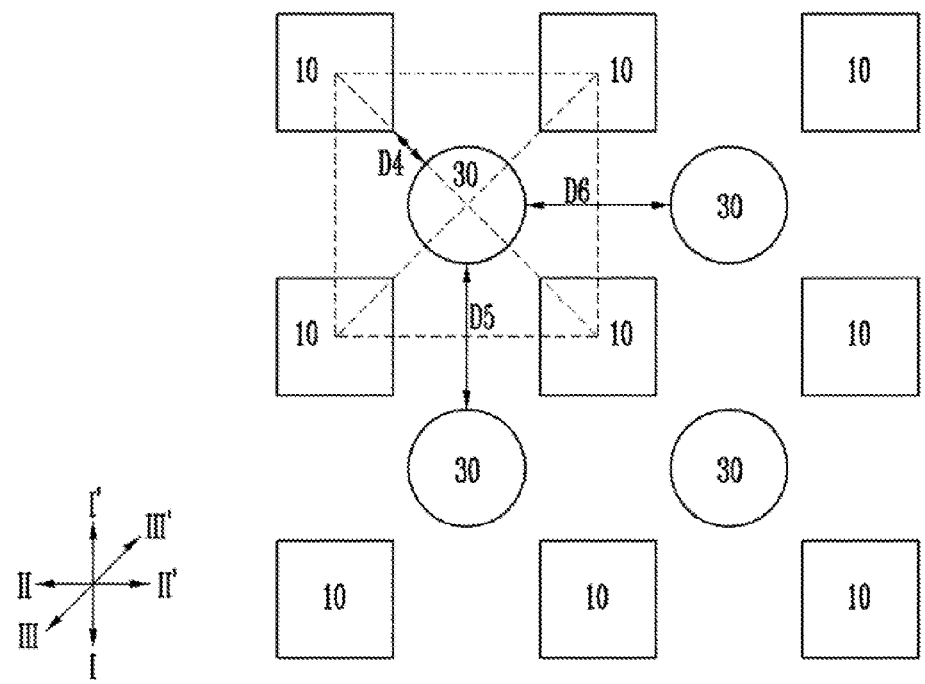
FIG. 2A to FIG. 2H illustrate more layouts for a stack of a semiconductor device, according to further embodiments of the present disclosure.

Referring to FIG. 2A, each of the contact plugs 30 may be disposed at a center of a square having four corners corresponding respectively to adjacent four supports 10 in the first and second directions I-I', and II-II'. In some embodiments, the adjacent pair of the supports 10 and the contact plugs 30 in the third direction III-III' may be spaced from each other by a fourth distance D4. Thus, the supports 10 and the contact plugs 30 may be arranged alternately and equidistantly in the third direction III-III'.

Further, adjacent contact plugs 30 in the first direction I-I' may be spaced from each other by a fifth distance D5. Adjacent contact plugs 30 in the second direction II-II' may be spaced from each other by a sixth distance D6. In some embodiments, the fifth and the sixth distances D5, D6 may be the same. In some other embodiments the fifth and the sixth distances D5, D6 may be different. In this way, in the first direction I-I', the contact plugs 30 may be equidistantly arranged. In the second direction II-II', the contact plugs 30 may be also equidistantly arranged.

Although, in FIG. 2A, four contact plugs 30 are equidistantly arranged between 9 equidistantly-arranged supports 10, the invention may not be limited in this way. For example, only some of the four contact plugs 30 may be so disposed.

Figure 2B:
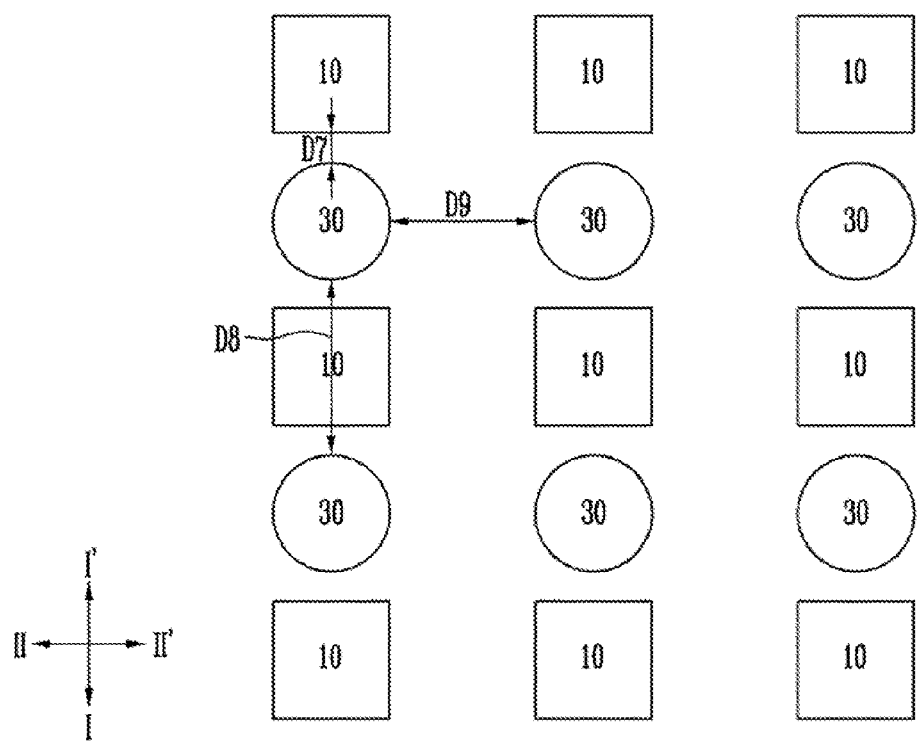

Referring to FIG. 2B, the contact plugs 30 may be arranged between the supports 10 arranged in the first direction I-I'. To be more specific, the supports 10 and the contact plugs 30 may be alternately arranged in the first direction I-I'. Further, the adjacent pair of one of the supports 10 and one of the contact plugs 30 in the first direction I-I' may be spaced from each other by a seventh distance D7. For example, in the first direction I-I', the supports 10 and the contact plugs 30 may be alternately and equidistantly arranged.

Further, the adjacent contact plugs 30 in the first direction I-I' may be spaced from each other by a eighth distance D8. The adjacent contact plugs 30 in the second direction II-II' may be spaced from each other by a ninth distance D9. In some embodiments, the eighth and the ninth distances D8, D9 may be the same. In some other embodiments, the eighth and the ninth distances D8, D9 may be different. For example, in an embodiment, in the first direction I-I', the contact plugs 30 may be equidistantly arranged. In another embodiment, in the second direction II-II', the contact plugs 30 may be equidistantly arranged. In yet another embodiment, the contact plugs 30 may be equidistantly arranged in both the first and second directions I-I' and II-II'.

Although, in FIG. 2B, six contact plugs 30 are equidistantly arranged between 9 equidistantly-arranged supports 10, the invention may not be limited in this way. For example, in an embodiment only some of the six contact plugs 30 may be so disposed.

Figure 2C:
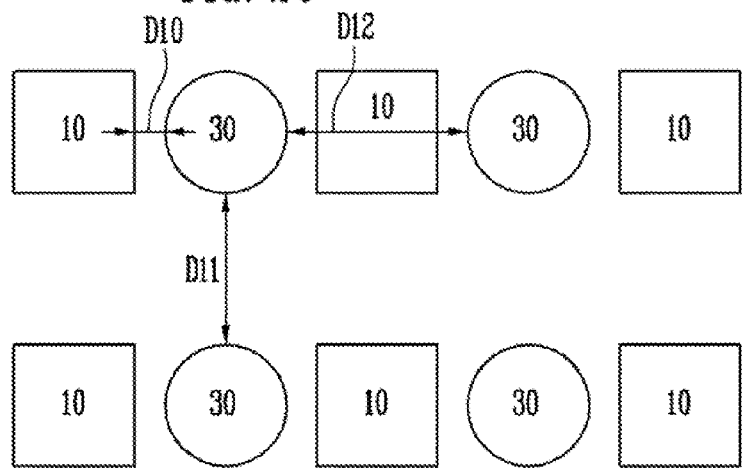

Referring to FIG. 2C, the contact plugs 30 may be arranged between the supports 10 arranged in the second direction II-II'. To be specific, the supports 10 and the contact plugs 30 may be alternately arranged in the second direction II-II'. Further, the adjacent pair of one of the supports 10 and one of the contact plugs 30 in the second direction II-II' may be spaced from each other by a tenth distance D10. In this way, in the second direction II-II', the supports 10 and the contact plugs 30 may be alternately and equidistantly arranged.

Further, the adjacent contact plugs 30 in the first direction I-I' may be spaced apart from each other by an eleventh distance D11. The adjacent contact plugs 30 in the second direction II-II' may be spaced apart from each other by a twelfth distance D12. In some embodiments, the eleventh and the twelfth distances D11, D12 may be the same. In some other embodiments, the eleventh and the twelfth distances D11, D12 may be different. In an embodiment, the contact plugs 30 may be equidistantly arranged in the first direction I-I'. In another embodiment the contact plugs 30 may be equidistantly arranged in the second direction II-II'. In yet another embodiment the contact plugs 30 may be equidistantly arranged in both the first and the second directions, I-I', II-II'.

Although, in FIG. 2C, six contact plugs 30 are shown to be equidistantly arranged between 9 equidistantly-arranged supports 10, the invention may not be limited in this way. For example, only some of the six contact plugs 30 may be so disposed.

Figure 2D:
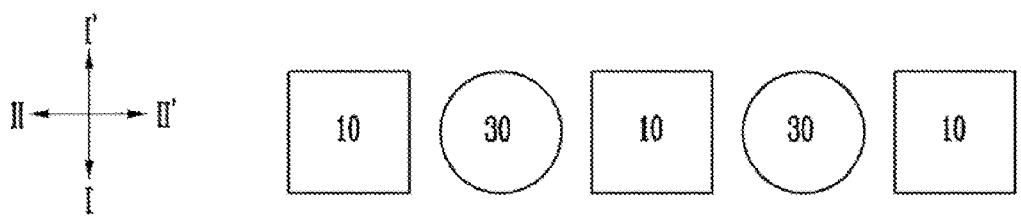
Figure 2D:
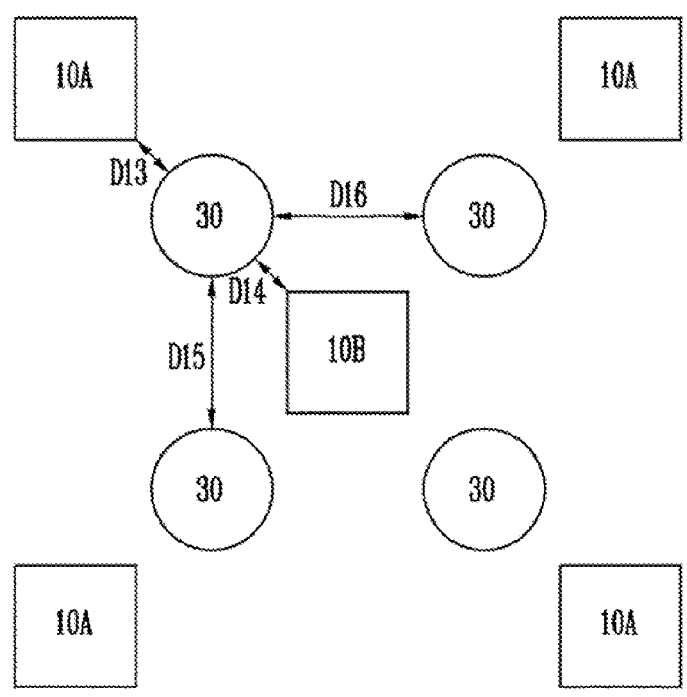

Referring to FIG. 2D, a second support 10B may be disposed at a center of a square having four corners corresponding respectively to adjacent four first supports 10A in the first and second directions I-I', and II-II'. Further, the contact plugs 30 may be disposed between the adjacent pair of one of the first supports 10A and the second support 10B in the third direction III-III'.

In some embodiments, the adjacent pair of one of the first supports 10A and the contact plug 30 in the third direction III-III' may be spaced from each other by a 13-th distance D13. An adjacent pair of the second support 10B and one of the contact plugs 30 in the third direction III-III' may be spaced from each other by a 14-th distance D14. In some embodiments, the 13-th and the 14-th distances D13, D14 may be the same. In some embodiments, the 13-th and the 14-th distances D13, D14 may be different. For example, in an embodiment, the first supports 10A, the contact plugs 30 and the second support 10B may be sequentially and equidistantly arranged in the third direction III-III'.

Adjacent contact plugs 30 in the first direction I-I' may be spaced from each other by a 15-th distance D15. Adjacent contact plugs 30 in the second direction II-II' may be spaced from each other by a 16-th distance D16. In some embodiments, the 15-th and the 16-th distances D15, D16 may be the same. In some other embodiments, the 15-th and the 16-th distances D15, D16 may be different. Hence, in an embodiment, the contact plugs 30 may be equidistantly arranged in the first direction I-I'. In another embodiment, the contact plugs 30 may be equidistantly arranged in the second direction II-II'. In yet another embodiment, the contact plugs 30 may be equidistantly arranged in both the first and second directions I-I', II-II'.

Although, in FIG. 2D, four contact plugs 30 are equidistantly arranged between five equidistantly arranged supports 10A, 10B, only some of the four contact plugs 30 may be disposed.

In the above described embodiments, the contact plugs 30 may be equidistantly arranged between the equidistantly-arranged supports 10, 10A, and 10B. In this way, not only the supports 10, 10A, 10B but also the contact plugs 30 may be patterned in regular patterns. This may lead to a uniform density distribution of the supports and the contact plugs. Accordingly, it may be possible to provide uniform control in terms of an etching depth, width, etc. in an etching process of the semiconductor device.

FIGS. 2E to 2H illustrate variations of the layouts for the stack of the semiconductor device as shown in FIGS. 2A to 2D. In these variations, the contact plugs 30 may be partially omitted unlike in the embodiments shown in FIGS. 2A to 2D.

Figure 2E:
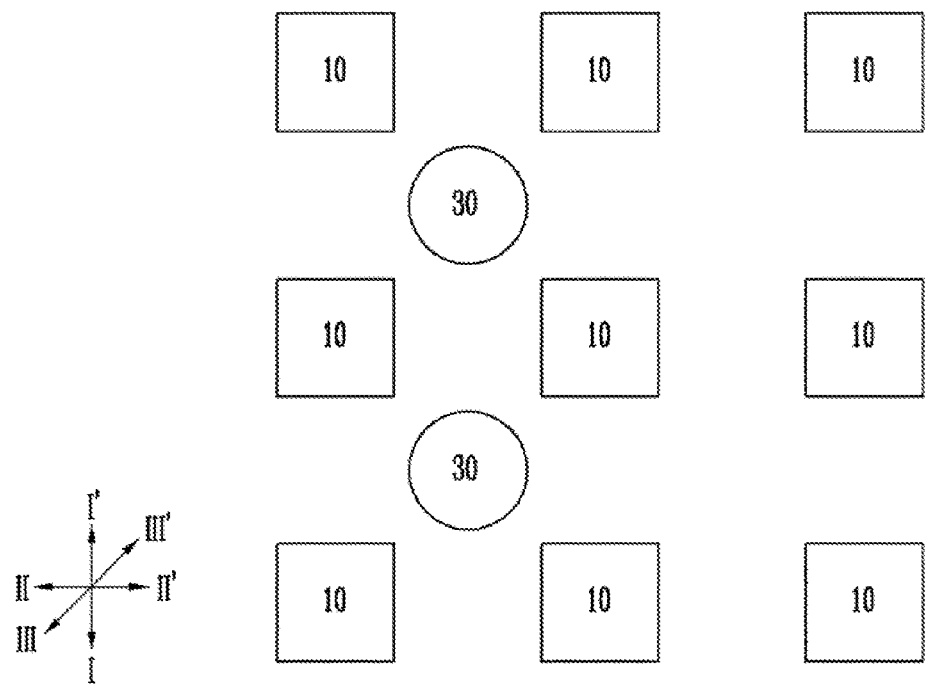

Referring to FIG. 2E, in contrast to FIG. 2A, only 2 contact plugs 30 are equidistantly arranged between 9 equidistantly-arranged supports 10.

Figure 2F:
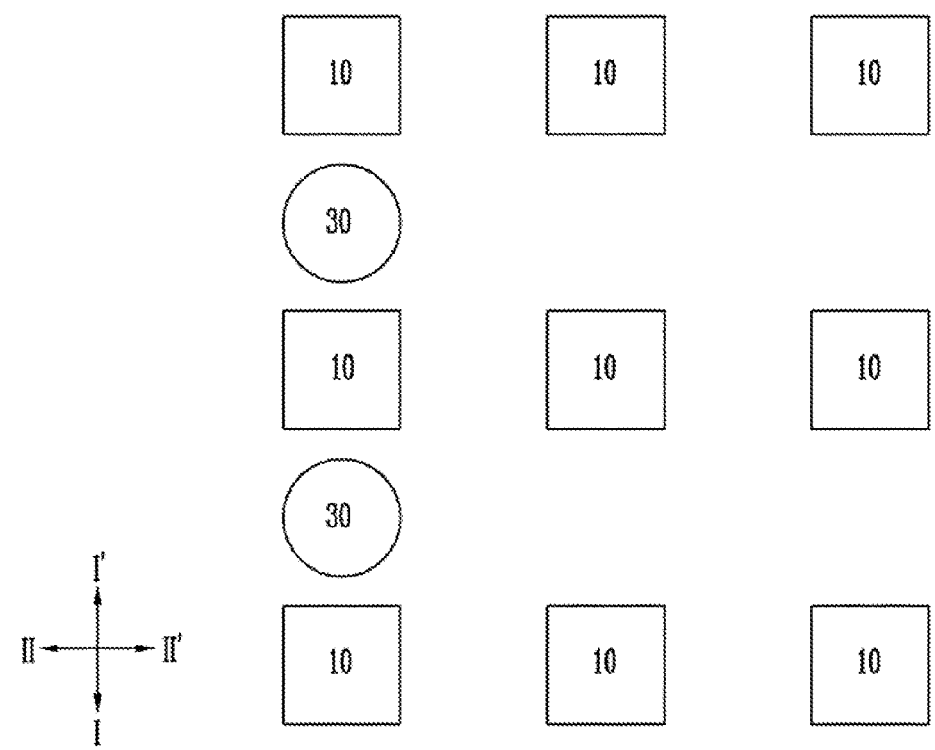

Referring to FIG. 2F, in contrast to FIG. 2B, only 2 contact plugs 30 are equidistantly arranged between 9 equidistantly-arranged supports 10.

Figure 2G:
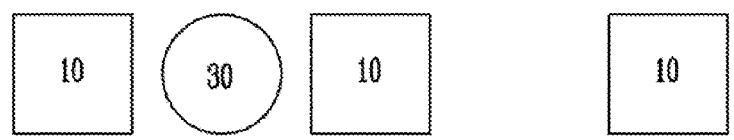
Figure 2G:
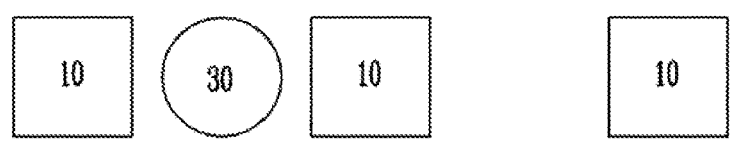
Figure 2G:
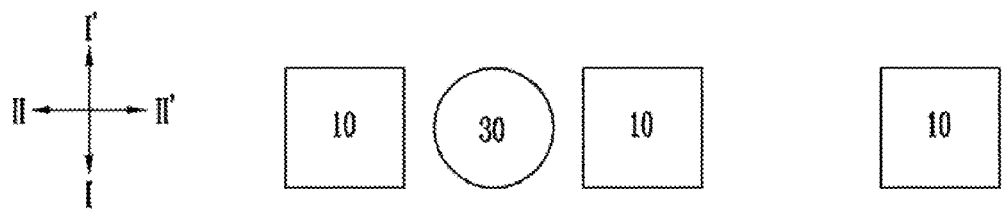

Referring to FIG. 2G, in contrast to FIG. 2C, only 3 contact plugs 30 are equidistantly arranged between 9 equidistantly-arranged supports 10.

Figure 2H:
Figure 2H:
Figure 2H:
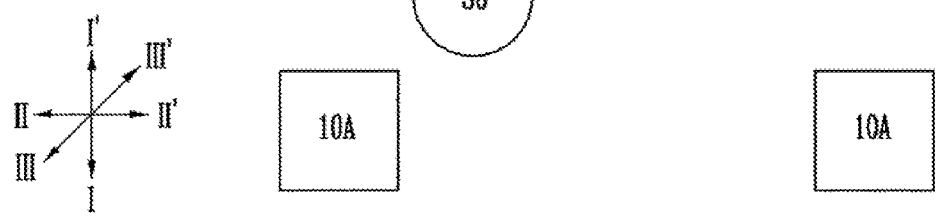

Referring to FIG. 2H, in contrast to FIG. 2D, only 2 contact plugs 30 are equidistantly arranged between 5 equidistantly-arranged supports 10.

In some embodiments, as shown in FIG. 3A, FIG. 4A and FIG. 5A, each of the contact plugs 30 may be coupled to each of the conductive layers of the stack. At least one of the contact plugs 30 may be coupled to a single conductive layer. Further, in the contact region, the stack may be patterned with a variety of structures to expose each of the plurality of conductive layers. For example, the stack in the contact region may be patterned in a step-wise manner in a first direction I-I'. In an alternative embodiment, the stack in the contact region may be patterned in a step-wise manner in a second direction II-II'. In another alternative embodiment, the stack in the contact region may be patterned in a step-wise manner in first and second directions I-I', and II-II'. In this way, the layout and the number of the contact plugs 30 may vary depending on the structures of the stack in the contact region.

Figure 3C:
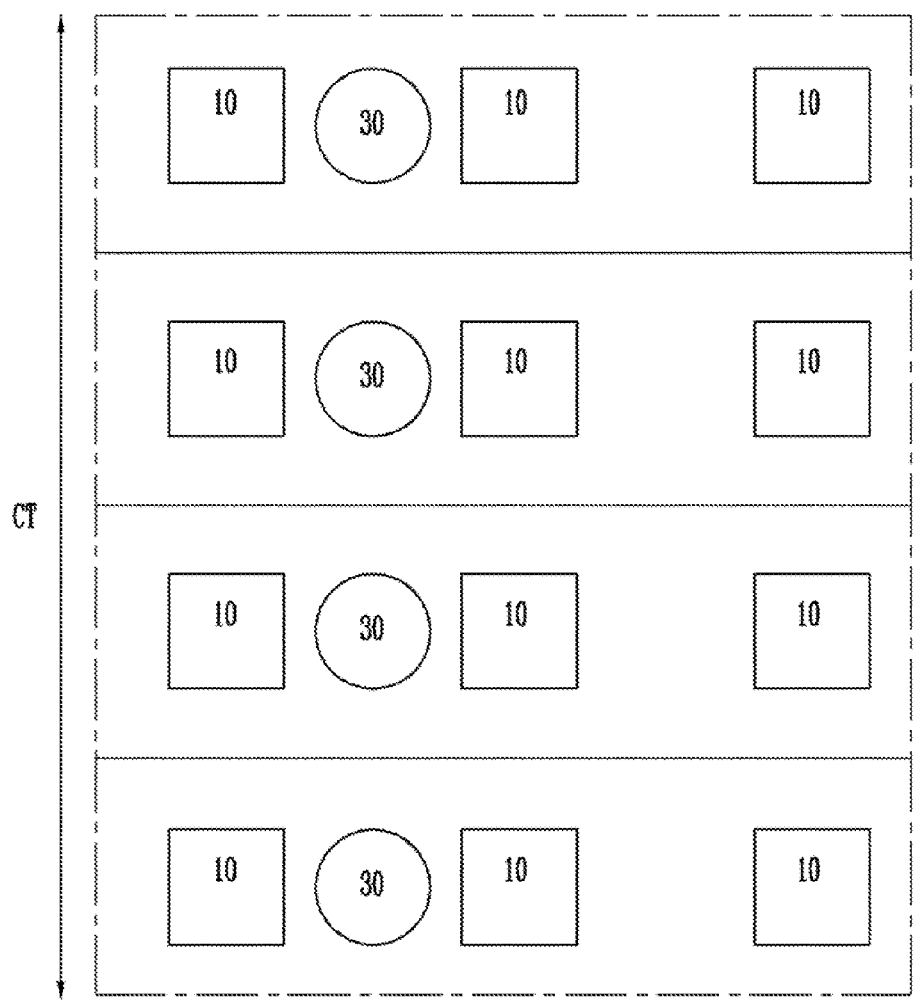

FIGS. 3A to 3C illustrate a stack structure of a semiconductor device, according to an embodiment of the present disclosure. FIG. 3A illustrates a perspective view of a structure of a stack in a contact region of a semiconductor device, according to an embodiment of the present disclosure. FIGS. 3B to 3C illustrate layouts for a contact region in a stack structure of the semiconductor device of FIG. 3A, according to an embodiment of the present disclosure.

Referring to FIG. 3A, a stack ST of the semiconductor device may include a cell region CE and contact region CT. In the cell region CE, memory cells may be stacked to form a memory string (not shown). In some embodiments, the memory string may include one of a U shaped string, a straight type string, a W shaped string, etc. In the contact region CT, interconnections for applying biases to corresponding gate electrodes of the memory cells may be disposed. Such interconnections may include a contact plug, a conductive line, and the like. The contact region CT may be defined to surround the cell region CE. In an embodiment two contact regions CT may sandwich a cell region CE therebetween. In another embodiment, the contact region CT may be disposed only at one side of the cell region CE.

The stack ST may include alternately stacked conductive layers 41 and insulating layers 42. In some embodiments, each of the conductive layers 41 may include one of tungsten W, tungsten nitride $WN_x$, titanium Ti, titanium nitride TiN, tantalum Ta, tantalum nitride TaN, silicon Si, and/or the like. In some embodiments, each of the insulating layers 42 may include one of an oxide, nitride, and the like.

In some embodiments, in a portion of the contact region CT, a sacrificial pattern may be located instead of the conductive layers. The sacrificial pattern may be formed as follows: during fabrication sacrificial layers (not shown) stacked with the insulating layers 42 may be replaced with the conductive layers 41, however, some of the sacrificial layers may not be replaced but remain, leading to the formation of a sacrificial pattern. The sacrificial pattern may have a high etch selectivity with respect to the insulating layers 42. For example, the insulating layers 42 may include an oxide, and the sacrificial pattern may include a nitride.

Further, the contact region CT in the stack ST may be formed in a step-wise shape in the first direction I-I'. In some embodiments, each step may include at least one of the conductive layers 41 and at least one of the insulating layers 42. Further, the conductive layers 41 may be sequentially exposed using the step-wise structure of the stack. The exposed portion of each of the conductive layers 41 may act as a pad portion of each of the conductive layers 41. For example, for each step, a contact plug 30 may pass through the insulating layer 42 and be coupled to the pad portion of an uppermost conductive layer 41 among the conductive layers 41.

It is noted that a single stack ST may act as a single memory block. For example, the semiconductor device may include a plurality of stacks ST, and a slit insulating layer (not shown) may be disposed between adjacent stacks ST to electrically insulate the adjacent memory blocks from each other. In some embodiments, the single memory block may correspond to a unit for an erase operation of a single data.

Referring to FIG. 3B, in the contact region CT, a plurality of supports 10 may be equidistantly arranged, and contact plugs 30 may be arranged between the supports 10. Further, for each step, each of the contact plugs 30 may be connected to each of the conductive layer 41. Each of the supports 10 may be positioned at a boundary between adjacent steps so that a single support 10 may contact both the vertically adjacent steps (as indicated in dot lines in FIG. 3A). Each of the contact plugs 30 may be positioned within each step (as indicated in dot lines in FIG. 3A) so that each plug 30 may be electrically connected to each of pad portions of the conductive layers 41.

Referring to FIG. 3C, in the contact region CT, a plurality of supports 10 may be equidistantly arranged, and contact plugs 30 may be arranged between the supports 10. Further, for each step, each of the contact plugs 30 may be coupled to each of the conductive layer 41. In some embodiments, the supports 10 and the contact plugs 30 may all be positioned within each step.

Figure 4B:
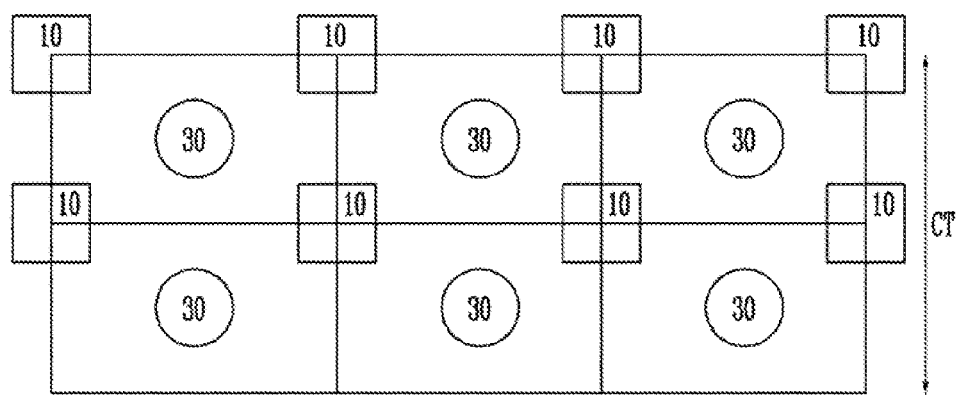
FIG. 4B to FIG. 4C illustrate layouts for a contact region in a stack structure of a semiconductor device according to another embodiment of the present disclosure.
Figure 4C:
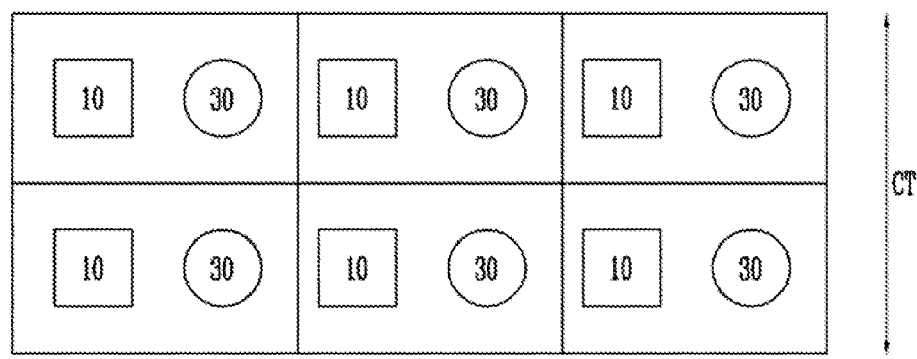
Figure 4C:
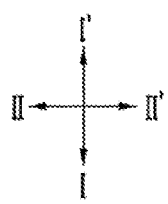

FIG. 4A to FIG. 4C illustrate a stack structure of a semiconductor device, according to another embodiment of the present disclosure. FIG. 4A illustrates a perspective view of a stack structure in a contact region of a semiconductor device. FIGS. 4B to 4C illustrate layouts for a contact region in the stack structure of FIG. 4A. Repetitive descriptions for similar structures and/or features as for FIGS. 3A to 3C may be omitted below.

Referring to FIG. 4A, a stack ST of the semiconductor device may include conductive layers 41 and insulating layers 42 alternately stacked. The stack ST may be divided into a cell region CE and contact region CT. Further, the stack ST in the contact region CT may be formed in a step-wise shape in the first direction I-I' and second direction II-II'. In some embodiments, the number of stacked layers in each of steps in the first direction I-I' may be different from the number of stacked layers in each of steps in the second direction II-II'. For example, the number of stacked layers in each of the steps in the second direction II-II' may be n (e.g., n=2), while the number of stacked layers in each of steps in the first direction I-I' may be 2n (e.g., 2n=4), where n may be an integer greater than 1.

Referring to FIG. 4B, each of the supports 10 may be positioned at a boundary between adjacent steps. More specifically, each support 10 may be positioned at a boundary between four adjacent steps in the first direction I-I' and the second direction II-II'. A single support 10 may contact the four adjacent steps in the first direction I-I' and the second direction II-II' (as indicated in dot-lines in FIG. 4A). Each of the contact plugs 30 may be positioned with each of steps (as indicated in dot-lines in FIG. 4A). Each plug 30 may be electrically connected to each of pad portions of the conductive layers 41.

Referring to FIG. 4C, in the contact region CT, a plurality of supports 10 may be equidistantly arranged, and contact plugs 30 may be arranged between the supports 10. Further, for each step, each of the contact plugs 30 may be coupled to each of the conductive layer 41. In some embodiments, the supports 10 and the contact plugs 30 may all be positioned within each step.

Figure 5B:
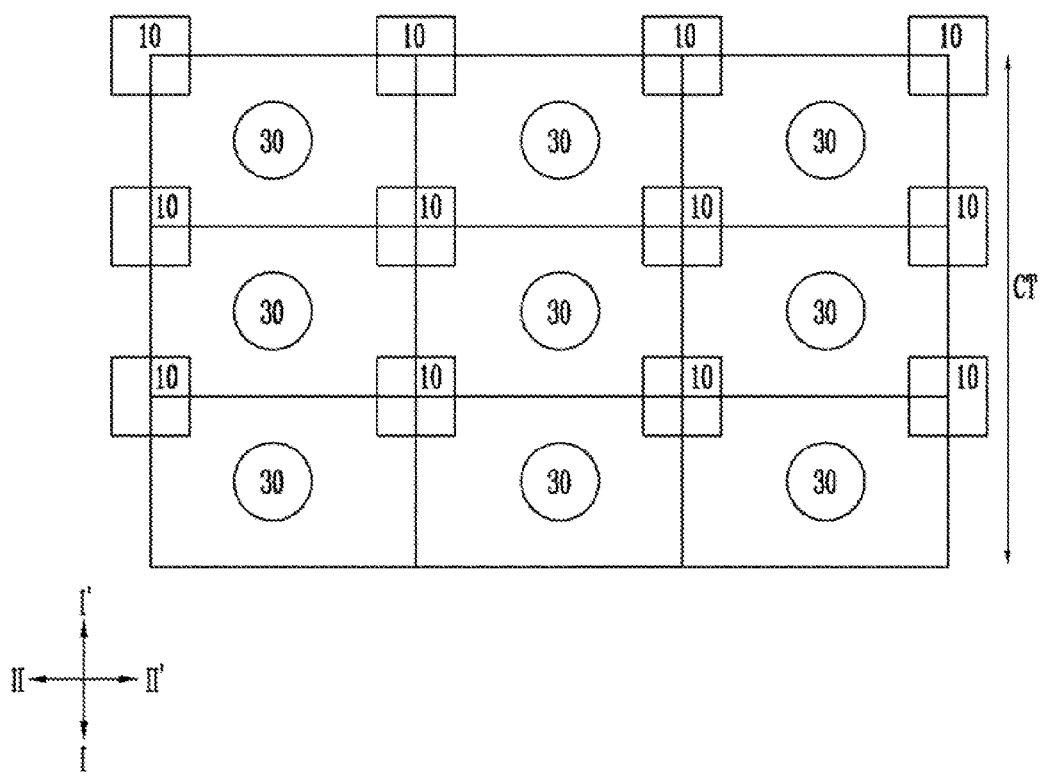
FIG. 5B to FIG. 5C illustrate layouts for a contact region in a stack structure of a semiconductor device, according to yet another embodiment of the present disclosure.
Figure 5C:
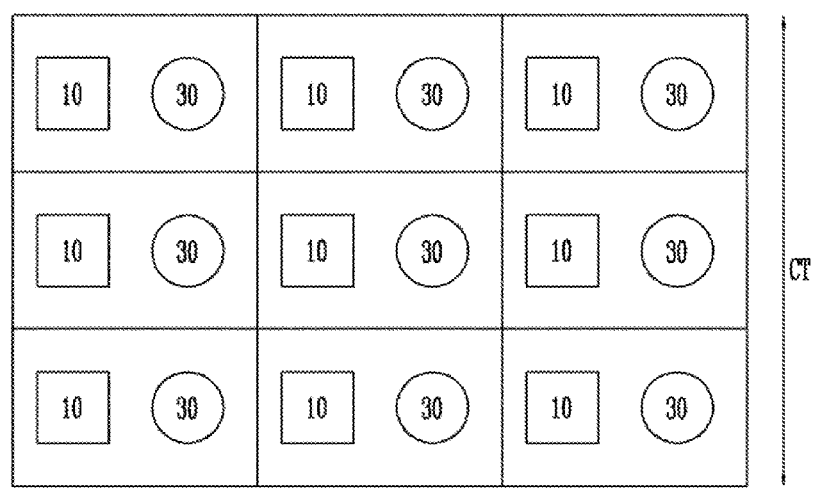
Figure 5C:
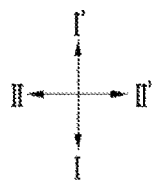

FIGS. 5A to 5C illustrate a stack structure of a semiconductor device, according to yet another embodiment of the present disclosure. FIG. 5A illustrates a perspective view of a stack structure in a contact region of a semiconductor device. FIGS. 5B to 5C illustrate layouts for a contact region in the stack of FIG. 5A. Repetitious descriptions of structures or features similar to the ones in FIGS. 3A to 3C and FIGS. 4A to 4C may be omitted.

Referring to FIG. 5A, a stack ST of the semiconductor device may include conductive layers 41 and insulating layers 42, alternately stacked. The stack ST may be divided into a cell region CE and contact region CT. Further, the stack ST in the contact region CT may be formed in a step-wise shape in the first direction I-I' and second direction II-II'. In some embodiments, a number of stacked layers in each of steps in the first direction I-I' may be different from a number of stacked layers in each of steps in the second direction II-II'. For example, a number of stacked layers in each of steps in the first direction I-I' may be n (e.g., n=2), while a number of stacked layers in each of steps in the second direction II-II' may be 3n (e.g., 3n=6), where n may be an integer greater than 1.

Referring to FIG. 5B, each of the supports 10 may be positioned at a boundary between adjacent steps. More specifically, each support 10 may be positioned at a boundary between four adjacent steps in the first direction I-I' and the second direction II-II'. A single support 10 may contact the four adjacent steps in the first direction I-I' and the second direction II-II' (as indicated in dot-lines in FIG. 5A). Each of the contact plugs 30 may be positioned within each step (as indicated in dot-lines in FIG. 5A). Each plug 30 may be electrically connected to each of pad portions of the conductive layers 41.

Referring to FIG. 5C, in the contact region CT, a plurality of supports 10 may be equidistantly arranged in the first and second directions I-I', II-II' and contact plugs 30 may be equidistantly arranged between the supports 10. Further, for each step, each of the contact plugs 30 may be coupled to each of the conductive layers 41. In some embodiments, the supports 10 and the contact plugs 30 may all be positioned within each step.

Figure 6:
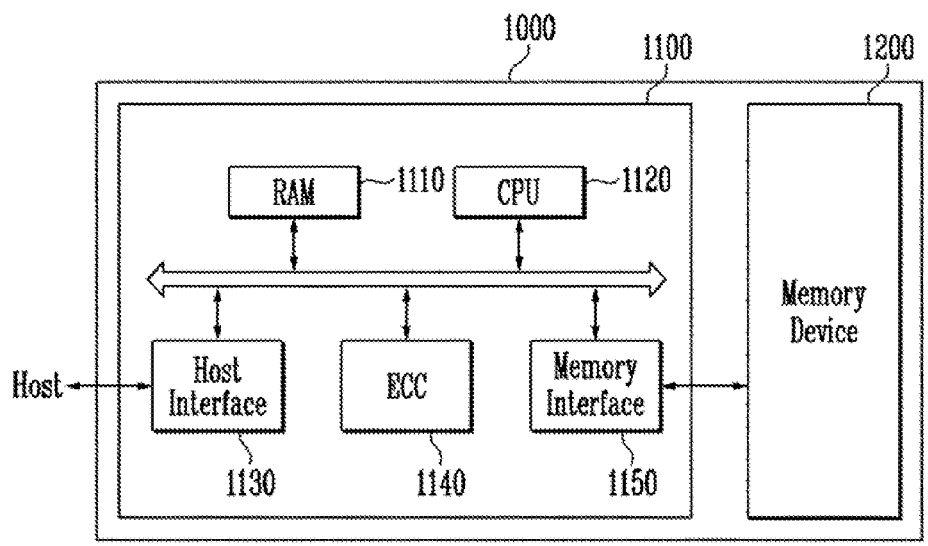
FIG. 6 illustrates a block diagram of a memory system, according to an embodiment of the present disclosure.

Referring now to FIG. 6 a memory system 1000 is provided, according to an embodiment of the present disclosure. For example, memory system 1000 may include a controller 1100 and a memory device 1200. The memory device 1200 may be used for storing data information in various types such as a text, graphic, software code, etc. The memory device 1200 may be implemented in a nonvolatile memory, and may include the configurations as above-addressed in connection to FIGS. 1A to 5C. In some embodiments, the memory device 1200 may include a stack including alternately stacked conductive layers and insulating layers; supports passing through the stack, each of the supports having a cross-section of an equilateral polygon or a circular shape, the supports being equidistantly arranged in a first direction and a second direction, the first and second directions crossing each other; and contact plugs coupled respectively to the conductive layers, each of the contact plugs being disposed between at least two adjacent supports of the supports. The memory device 1200 may have the same structure and the same manufacturing method as in any of the embodiments described herein. Thus, details about the structure and the manufacturing method of memory device 1200 are now omitted.

The controller 1100 may be any suitable controller. For example, the controller may be coupled to a host (not shown) and the memory device 1200, and may be configured to access, in response to a request from the host, the memory device 1200. For example, the controller 1100 may be configured to control read, write, erase, background operations or the like of the memory device 1200.

For example, the controller 1100 may include a random access memory (RAM) 1110, a central processing unit (CPU) 1120, a host interface 1130, an error correction code (ECC) circuit 1140, and a memory interface 1150.

In some embodiments, the RAM 1110 may be employed as a work memory for the CPU 1120, as a cache memory between the memory device 1200 and the host, or as a buffer memory between the memory device 1200 and the host and/or any combinations thereof. It may be noted that any suitable RAM may be employed. In an embodiment the RAM 1110 may be replaced with a static random access memory (SRAM). In yet another embodiment the RAM may be replaced with a read only memory (ROM).

The CPU 1120 may be any suitable CPU configured to control all of operations of the controller 1100. In one example, the CPU 1120 may be configured to operate firmware such as flash translation layer (FTL) stored in the RAM 1110.

The host interface 1130 may interface with the host. In one example, the controller 1100 may communicate with the host over at least one of various interface protocols such as a universal serial bus (USB) protocol, a multi-media card (MMC) protocol, a peripheral component interconnection (PCI) protocol, a PCI express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, and/or the like.

The ECC circuit 1140 may be configured to detect and correct an error in data received from the memory device 1200 using the error correction code ECC.

The memory interface 1150 may interface with the memory device 1200. For example, the memory interface 1150 may include a NAND interface or NOR interface.

It may be noted that the controller 1100 may further include a buffer memory (not shown) for storing data temporarily. In some embodiments, the buffer memory may store data temporarily. Data stored temporarily in the buffer memory may include data to be sent to the memory device 1200 via the memory interface 1150 or data to be sent to an external device via the host interface 1130.

Further, it may be appreciated by the skilled person in the art that the controller 1100 may be provided with a ROM (not shown) for storing code data to interface with the host system or host.

The memory system 1000 may include the memory device 1200 having the stable or rigid structure as described above and thus an improved yield. Further, the memory system 1000 itself may have a more stable or rigid structure further improving the overall yield of the memory system.

Figure 7:
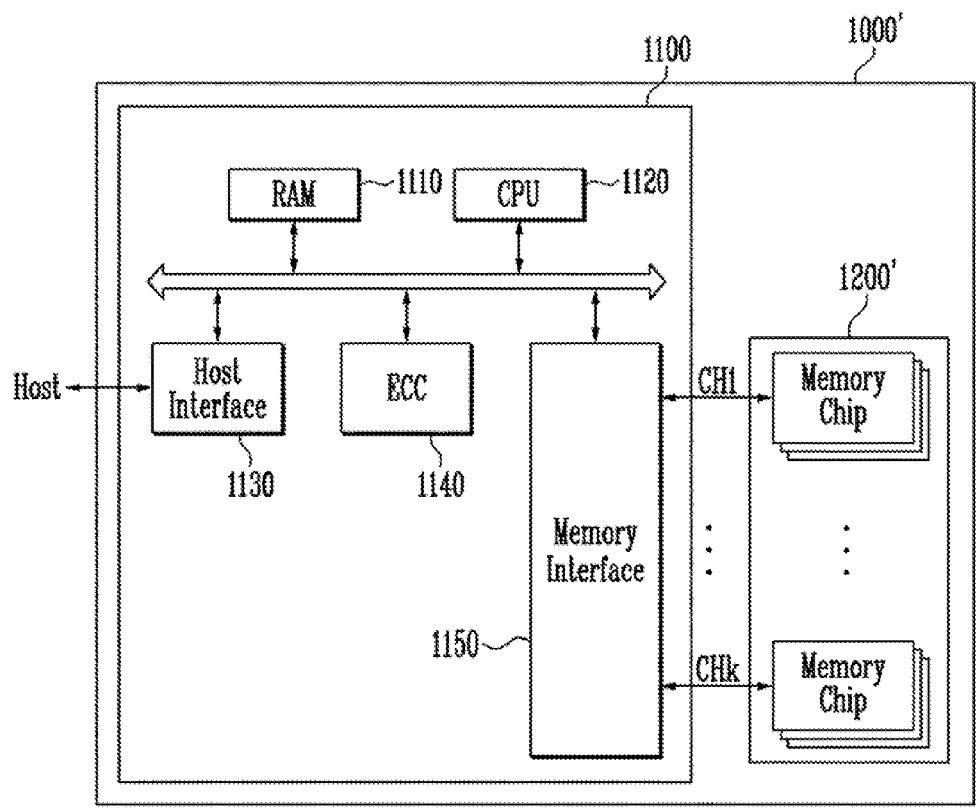
FIG. 7 illustrates a block diagram of a memory system, according with another embodiment of the present disclosure.

FIG. 7 illustrates a block diagram of a memory system in accordance with another embodiment of the present disclosure.

Referring to FIG. 7, the memory system 1000' may include a memory device 1200' and the controller 1100 as shown in FIG. 6. The controller 1100 may include the RAM 1110, the CPU 1120, the host interface 1130, the ECC circuit 1140, and the memory interface 1150.

The memory device 1200' may be implemented in a nonvolatile memory, and may include the configurations as above-addressed in connection to FIGS. 1A to 5C. In some embodiments, the memory device 1200' may include a stack including alternately stacked conductive layers and insulating layers; supports passing through the stack, each of the supports having a cross-section of an equilateral polygon or a circular shape, the supports being equidistantly arranged in a first direction and a second direction, the first and second directions crossing each other; and contact plugs coupled respectively to the conductive layers, each of the contact plugs being disposed between at least two adjacent supports of the supports. The memory device 1200' may have the same structure and the same manufacturing method thereof as in the above-described embodiments. Thus, details about the structure and the manufacturing method may be omitted.

The memory device 1200' may be implemented in a multi-chip package composed of a plurality of memory chips. The plurality of memory chips may be divided to a plurality of groups. The plurality of groups may communicate respectively via first to k-th channels CH1 to CHk with the controller 1100. Each group may be configured to communicate via a single common channel with the controller 1100. It may be appreciated that the memory system 1000' may according to a variation thereof having a single channel assigned to a single memory chip.

The memory system 1000' may include the memory device 1200' with a stable or rigid structure having an improved yield thereof. Moreover, the memory system 1000' itself also may also have a more stable or rigid structure and thus an improved overall yield thereof. It may be appreciated that via a multi-chip package configuration of the memory device 1200', the memory system 1000' may have an increased data storage capacity, and a higher operation rate.

Figure 8:
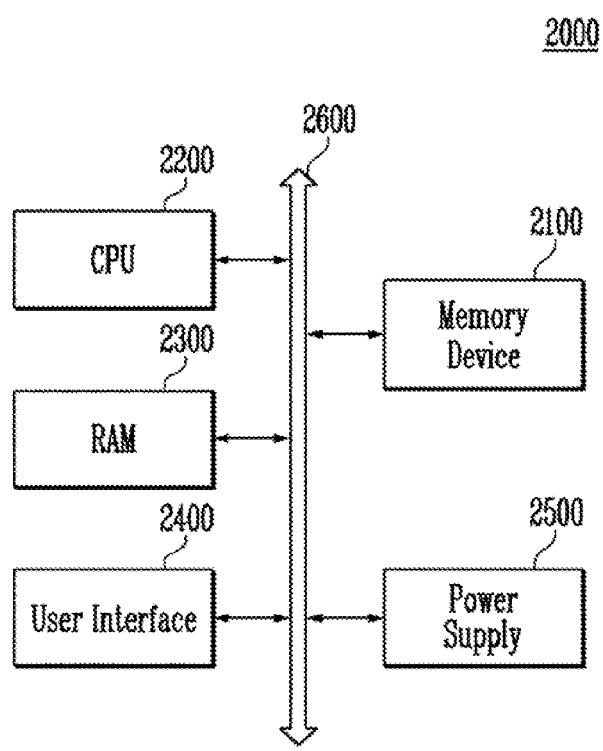
FIG. 8 illustrates a block diagram of a computing system, according to an embodiment of the present disclosure.

FIG. 8 illustrates a block diagram of a computing system, according to an embodiment of the present disclosure.

Referring to FIG. 8, a computing system 2000 may include a memory device 2100, a central processing unit (CPU) 2200, a random access memory (RAM) 2300, a user interface 2400, a power-supply 2500, and a system bus 2600.

The memory device 2100 may store data supplied via the user interface 2400, and/or data processed by the CPU 2200 or/and the like. Further, the memory device 2100 may be electrically coupled, via the system bus 2600, to the CPU 2200, the RAM 2300, the user interface 2400, and the power-supply 2500. In one example, the memory device 2100 may be coupled via the controller (not shown) to the system bus 2600, or may be directly coupled to the system bus 2600. When the memory device 2100 is directly connected to the system bus 2600, the function of the controller may be carried out by the CPU 2200.

The memory device 2100 may be implemented in a nonvolatile memory, and may include the configurations as above-addressed in connection to FIGS. 1A to 5C. In some embodiments, the memory device 2100 may include a stack including alternately stacked conductive layers and insulating layers; supports passing through the stack, each of the supports having a cross-section of an equilateral polygon or a circular shape, the supports being equidistantly arranged in a first direction and a second direction, the first and second directions crossing each other; and contact plugs coupled respectively to the conductive layers, each of the contact plugs being disposed between at least two adjacent supports of the supports. The memory device 2100 may have the same structure and the same manufacturing method as in the above-described embodiments. Thus, details about the structure and the manufacturing method may be omitted.

Further, the memory device 2100 may be implemented in a multi-chip package composed of a plurality of memory chips as in FIG. 7.

In one embodiment, the computing system 2000 may include a computer, a ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game player, a navigation device, a black box, a digital camera, a 3-dimensional television, a digital audio recorder, a digital audio player, a digital picture recorder, a digital picture player, a digital video recorder, a digital video player, a device with a wireless data communication, at least one electronic device as a home networking component, at least one electronic device as a computer networking component, at least one electronic device as a telematics networking component, a radio frequency identification (RFID) device, and/or the like.

The computing system 2000 may include the memory device 2100 with a stable or rigid structure having an improved yield. Moreover, the computing system 2000 may also have a more stable or rigid structure and thus an improved overall yield thereof. It may be appreciated that employing a multi-chip package configuration for the memory device 2100, the computing system 2000 may have an increased data storage capacity, and a higher operation rate.

Figure 9:
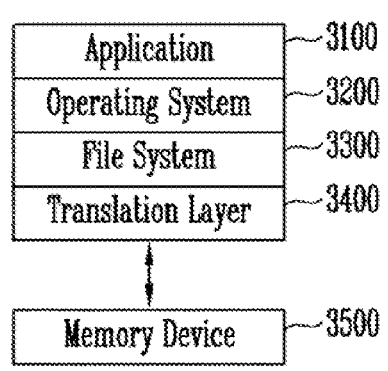
FIG. 9 illustrates a block diagram of a computing system, according to another embodiment of the present disclosure.

FIG. 9 illustrates a block diagram of a computing system, according to another embodiment of the present disclosure.

Referring to FIG. 9, a computing system 3000 may include a software layer such as an application 3100, an operating system 3200, a file system 3300, and a translation layer 3400. Further, the computing system 3000 may include a hardware layer such as a memory device 3500.

The operating system 3200 may be configured to manage software and/or hardware resources or the like of the computing system 3000 and may control a program execution via the CPU (not shown). The application 3100 may be implemented in various application programs executed in the computing system 3000, including utilities executed by the operating system 3200.

The file system 3300 may refer to a logical structure for managing data, files and/or the like present in the computing system 3000 and may organize files or data to be stored in the memory device 3500 based on rules. The file system 3300 may be any suitable one depending on the operating system 3200 running on the computing system 3000. In one example, when the operating system 3200 is implemented in Windows series by Microsoft Corporation, the file system 3300 may, for example, include a file allocation table (FAT), or a new technology file system (NTFS). Otherwise, when the operating system 3200 is implemented in Unix/Linux series, the file system 3300 may include an extended file system (EXT), a unix file system (UFS), or a journaling file system (JFS).

It may be appreciated that although the operating system 3200, application 3100 and file system 3300 are shown in individual blocks respectively in FIG. 9, the application 3100 and file system 3300 may be incorporated in the operating system 3200.

The translation layer 3400 may translate an address into a format complying with the memory device 3500 in a response to a request from the file system 3300. In an example, the translation layer 3400 may translate a logical address generated from the file system 3300 to a physical address of the memory device 3500. In some embodiments, mappings between the logical address and physical address may be stored in an address translation table. In an example, the translation layer 3400 may be implemented in a flash translation layer (FTL), or a universal flash storage link layer (ULL).

The memory device 3500 may be implemented in a nonvolatile memory, and may include the configurations as above-addressed in connection to FIGS. 1A to 5C. In some embodiments, the memory device 3500 may include a stack including alternately stacked conductive layers and insulating layers; supports passing through the stack, each of the supports having a cross-section of an equilateral polygon or a circular shape, the supports being equidistantly arranged in a first direction and a second direction, the first and second directions crossing each other; and contact plugs coupled respectively to the conductive layers, each of the contact plugs being disposed between at least two adjacent supports of the supports. The memory device 3500 may have the same structure and the manufacturing method thereof as in the above-described embodiments. Thus, details about the structure and the manufacturing method may be omitted.

The computing system 3000 may be divided into an operation system layer corresponding to an upper level region and a controller layer corresponding to a lower level region. In some embodiments, the application 3100, operating system 3200 and file system 3300 may be defined in the operating system layer, and may be associated with a work memory for the computing system 3000. Further, the translation layer 3400 may be defined in either the operating system layer or the controller layer.

The computing system 3000 may include the memory device 3500 with a stable or rigid structure having an improved yield. Moreover, the computing system 3000 may also have a more stable or rigid structure and thus an improved yield thereof.

The above description is not to be taken in a limiting sense, but is made merely for the purpose of describing the general principles of embodiments. Many additional embodiments of the invention may be envisaged by those skilled in the art to which this invention pertains after having read the present disclosure without departing from the spirit and/or scope of the invention as defined by the appended claims. Moreover, reference throughout this specification to "an embodiment," or similar language means that a particular feature, structure, or characteristic that is described in connection with the embodiment is included in at least one embodiment of the present disclosure. Thus, appearances of the phrases "in an embodiment," and similar language throughout this specification may, but do not necessarily, all refer to the same embodiment.

What is claimed is:

1. A semiconductor device comprising:
a stack including alternately stacked conductive layers and insulating layers;
supports passing through the stack, each of the supports having a cross-section of an equilateral polygon or a circular shape, the supports being equidistantly arranged in a first direction and a second direction, the first and second directions crossing each other; and
contact plugs coupled respectively to the conductive layers, each of the contact plugs being disposed between at least two adjacent supports of the supports.

2. The device of claim 1, wherein the equilateral polygon includes a square, a rhombus.

3. The device of claim 1, wherein a spacing between adjacent supports in the first direction is equal to or different from a spacing between adjacent supports in the second direction.

4. The device of claim 1, wherein each of the contact plugs is disposed between adjacent supports in the first direction.

5. The device of claim 4, wherein the supports and the contact plugs are alternately and equidistantly arranged in the first direction.

6. The device of claim 4, wherein the contact plugs are equidistantly arranged in the first direction, and the contact plugs are equidistantly arranged in the second direction.

7. The device of claim 1, wherein each of the contact plugs is disposed between adjacent supports in the second direction.

8. The device of claim 7, wherein the supports and the contact plugs are alternately and equidistantly arranged in the second direction.

9. The device of claim 1, wherein each of the contact plugs is disposed between adjacent supports in a third direction, the third direction crossing with the first and second directions.

10. The device of claim 9, wherein the supports and the contact plugs are alternately and equidistantly arranged in the third direction.

11. The device of claim 9, wherein the contact plugs are equidistantly arranged in the first direction, and the contact plugs are equidistantly arranged in the second direction.

12. The device of claim 1, further comprising:
additional supports passing through the stack, each of the additional supports being disposed between the adjacent supports in a third direction, the third direction crossing with the first and second directions.

13. The device of claim 12, wherein the supports and the additional supports are alternately and equidistantly arranged in the third direction.

14. The device of claim 12, wherein each of the contact plugs is disposed between two adjacent supports including one of the supports and one of the additional supports in the third direction.

15. The device of claim 14, wherein the supports, the additional supports and the contact plugs are equidistantly arranged in the third direction.

16. The device of claim 1, where the stack is formed in a step-wise shape in the first direction.

17. The device of claim 16, wherein each of the supports is positioned at a boundary between adjacent steps of the stack, and each of the contact plugs is positioned within each step.

18. The device of claim 16, wherein each of the supports and each of the contact plugs are positioned within each step.

19. The device of claim 1, wherein the stack is formed in a step-wise shape in the first direction and the second direction.

20. The device of claim 19, wherein each of the supports is positioned at a boundary between adjacent steps of the stack, and each of the contact plugs is positioned within each step.

* * * * *